United States Patent
Leibovitz et al.

Patent Number: 5,086,335
Date of Patent: Feb. 4, 1992

[54] TAPE AUTOMATED BONDING SYSTEM WHICH FACILITATE REPAIR

[75] Inventors: Jacques Leibovitz, San Jose; Kenneth D. Scholz, Palo Alto; V. K. Nagesh, Cupertino; Clinton C. Chao, Redwood City, all of Calif.

[73] Assignee: Hewlett-Packard Company, Palo Alto, Calif.

[21] Appl. No.: 560,511

[22] Filed: Jul. 31, 1990

[51] Int. Cl.⁵ .................. H01L 23/12; H01L 23/48
[52] U.S. Cl. ............................................... 357/70
[58] Field of Search ................................ 357/70, 80

[56] References Cited

U.S. PATENT DOCUMENTS

| | | | |
|---|---|---|---|
| 3,912,852 | 10/1975 | Simon | 357/70 |
| 4,028,722 | 6/1977 | Holda | 357/70 |
| 4,438,181 | 3/1984 | Schroeder | 357/70 |
| 4,459,607 | 7/1984 | Reid | 357/71 |
| 4,696,526 | 9/1987 | Newton et al. | 439/68 |
| 4,800,419 | 1/1989 | Long et al. | 357/70 |
| 4,806,503 | 2/1989 | Yoshida et al. | 437/206 |
| 4,899,207 | 2/1990 | Hallowell et al. | 357/70 |
| 4,903,114 | 2/1990 | Aoki et al. | 357/75 |
| 4,967,261 | 10/1990 | Niki et al. | 357/70 |

FOREIGN PATENT DOCUMENTS

| | | | |
|---|---|---|---|
| 60-176246 | 9/1985 | Japan | 357/70 |
| 62-2628 | 1/1987 | Japan | 357/70 |
| 1-268045 | 10/1989 | Japan | 357/75 |

*Primary Examiner*—Rolf Hille
*Assistant Examiner*—S. V. Clark

[57] ABSTRACT

An interconnection system and method for linking electronic devices such as semiconductor chips. Inner leads of a tape automated bonding frame are aligned with pads on the semiconductor chip. Inner lead bonding fixes the lead frame to the chip. Outer leads of the tape automated bonding frame are brought into an overlapping relationship with conductive traces on a substrate. Rather than microbonding the outer leads to the traces of the substrate, bond wires are attached to the outer leads and the traces, thereby allowing electrical communication of input and output signals therebetween. In one embodiment, the tensile strength of the bond wires is greater than that of the outer leads. In a second embodiment, the bond strength of the wire to the outer lead is greater than the bond strength of the wire to the substrate trace.

2 Claims, 2 Drawing Sheets

TAPE AUTOMATED BONDING SYSTEM WHICH FACILITATE REPAIR

DESCRIPTION

1. Technical Field

The present invention relates generally to tape automated bonding and particularly to repair of circuitry interconnected by tape automated bonding.

2. Background Art

In the electronics industry, ever-present goals are to miniaturize integrated circuit chip packaging and to minimize the lengths of interconnections between chips. Multi-chip modules were designed to address these goals. Multi-chip modules package and interconnect a plurality of chips in a functional relationship. The advantages of multi-chip modules are primarily in terms of packaging density and operational speed. The main disadvantage involves the cost of manufacturing such modules.

Among the reasons for the high cost of multichip modules is the relatively low manufacturing yield of the modules. As the number of integrated circuit chips within a package increases, the likelihood of a defect within the package also increases. Typically, testing of the individual chips prior to interconnection within a multi-chip module is not possible. Later detection of a defective chip within a module may result in the entire module having to be discarded.

An interconnection technique which permits pretesting of chips is referred to as "tape automated bonding". This fabrication procedure utilizes a continuous insulated tape which is similar to photographic film to provide a planar substrate for chips that are attached to individual sections, or frames, of the tape. A spider-like metal pattern of conductive traces is etched on each frame. The traces may either "fan out", i.e. radiate from the center of the frame to the four edges, or may be four sets of parallel lines, with each set extending perpendicularly from one edge of a chip. The chip is carefully aligned over the center of the frame so that the contacts of the chip are precisely located at corresponding conductive traces in the central portion of the frame. The chip is then attached to the tape automated bonding frame. This connection of the chip contacts to the inner portion of the frame is referred to as "inner lead bonding".

After the inner lead bonding has been performed, the integrated circuit chip may be tested. U.S. Pat. No. 4,696,526 to Newton et al. teaches a carrier for the testing of a tape automated bonding mounted chip prior to interconnection with other chips. The Newton et al. patent teaches that the outer leads of the conductive traces of the frame are to be connected to a substrate prior to testing. However, testing of a chip may also take place prior to "outer lead bonding".

As noted above, typically inner lead bonding requires precise alignment of the chip contacts with the frame inner leads. The sites are simultaneously bonded by thermocompression or gold-tin eutectic methods. U.S. Pat. No. 4,459,607 to Reid teaches that this precision manufacture of the frame to match the chip contacts is not necessary if wires are used to bridge the gap between chip contacts and the inner leads of the lead frame. However, the precision alignment of inner leads with the chip contacts is preferred, since the bridging of a gap at the inner leads is likely to add undesired inductance to the assembly.

After testing of a chip, the outer leads of the lead frame are microbonded to the pads of a substrate. Again, precision alignment is critical. U.S. Pat. No. 4,899,207 to Hallowell et al. teaches an assembly for aiding in the alignment of outer leads to a substrate. The assembly includes a support ring which secures the conductive traces in proper position relative to the contacts of a substrate.

While tape automated bonding provides an important improvement in the interconnection of integrated circuit chips because it allows pretesting of chips, rework and repair of a circuit having a number of chips is still problematic. A chip having a size less than one-half inch in length may have more than 400 connection sites. Removal of a single chip from a larger circuit typically requires disconnection of each of the more than 400 outer leads from the substrate connection sites. Devices have been manufactured to remove the chip and the lead frame by desoldering the lead frame at the outer leads. However, even after this has been accomplished each connection site on the substrate must be cleaned and prepared for connection to a replacement chip and lead frame. The cleaning and preparing can be a laborious task.

U.S Pat. No. 4,806,503 to Yoshida et al. teaches a method of replacing integrated circuit chips interconnected within a multi-chip module by use of tape automated bonding. The method of Yoshida et al. is to cut the conductive traces of the lead frame at the centers of the conductive traces. That is, the outer lead bonds are left intact to support the outer portions of the conductive traces. A replacement part having a lead frame with conductive traces sufficiently long to overlap the conductive traces left from the first-installed lead frame is then precisely aligned to allow bonding of the second lead frame to the conductive traces of the original lead frame. While the Yoshida et al. method does permit replacement of chips within a multi-chip module, the method requires a second set of microbonds. It is preferred that the number of microbonds be minimized. Moreover, as noted above, bonding devices exist to secure lead frames to substrates. These bonding devices may not be dimensionally or functionally adaptable to microbond a first lead frame to a second lead frame.

It is an object of the present invention to provide a system and method for interconnecting electronic devices wherein the system and method allow testing of devices prior to final mounting and wherein the resulting assembly can be easily reworked or can be removed in its entirety.

SUMMARY OF THE INVENTION

The above object has been met by use of tape automated bonding in which outer leads of a lead frame are aligned with the connection sites of a substrate, but the outer leads are not directly bonded to the connection sites. Preferably, the outer leads overlap the connection sites, but instead of microbonding the outer leads to the connection sites, a bond wire is used.

An electronic device, typically an integrated circuit chip, having a plurality of first connection sites is aligned with inner leads of a tape automated bonding lead frame. The inner leads and first connection sites are then bonded. The resulting assembly of the chip and the lead frame can be used for testing of the chip.

If the test results are positive, the outer leads of the lead frame are aligned with second connection sites on a substrate. The substrate may be the packaging of a multi-chip module or may be a printed circuit board. As noted above, although the alignment of the outer leads preferably brings the outer leads into contact with the second connection sites, the outer leads are not bonded to the connection sites. Instead, conductive wires are microbonded to the outer leads and to the second connection sites to provide electrical communication therebetween.

An advantage of the present invention is that a chip and its associated lead frame can easily be replaced if the chip is later found to be defective. In one embodiment, the tensile strength of the wires is less than the tensile strength of the outer leads. Thus, the wires are broken upon removal of the lead frame. A new assembly of a replacement chip and a lead frame can then be aligned with the connection sites of the substrate, whereafter wires are again used to interconnect the chip and the substrate.

Alternatively, the bond strength ("$B^1$") of the outer leads to the wires may be greater than the bond strength ("$B^2$") of the wires to the second connection sites. Thus, the wires will be peeled from the connection sites by removal of the chip from the substrate. In this embodiment, however, it is imperative that the bond strength ($B^2$) of the wires to the second connection sites is less than the bond strength ("$B^3$") of the second connection sites to the substrate. That is, the relationships must be $B^1 > B^2$ and $B^3 > B^2$. The differentiations in bond strengths ensure that the wires can be peeled from the second connection sites without affecting the integrity of the second connection sites to the substrate.

Attachment of the wires while still aligning the outer leads to the substrate connection sites ensures that the inductance of the electrical connection is not significantly greater than the inductance involved if the outer bonds were directly microbonded to the substrate connection sites. Thus, the present invention does not adversely affect the overall circuit. In comparison to the prior art method of thermocompression bonding the outer leads to the substrate connection sites, here replacement of a chip and its lead frame does not require a tedious preparation of the connection sites prior to reattachment to a lead frame. Rather, the replacement assembly includes replacement wires which are bonded to portions of the connection sites spaced apart from the original wires.

Another advantage of the present invention is that the assembly can be easily reworked. For example, a wire can easily be unattached and relocated to improve alignment.

BEST MODE FOR CARRYING OUT THE INVENTION

Figure 1:
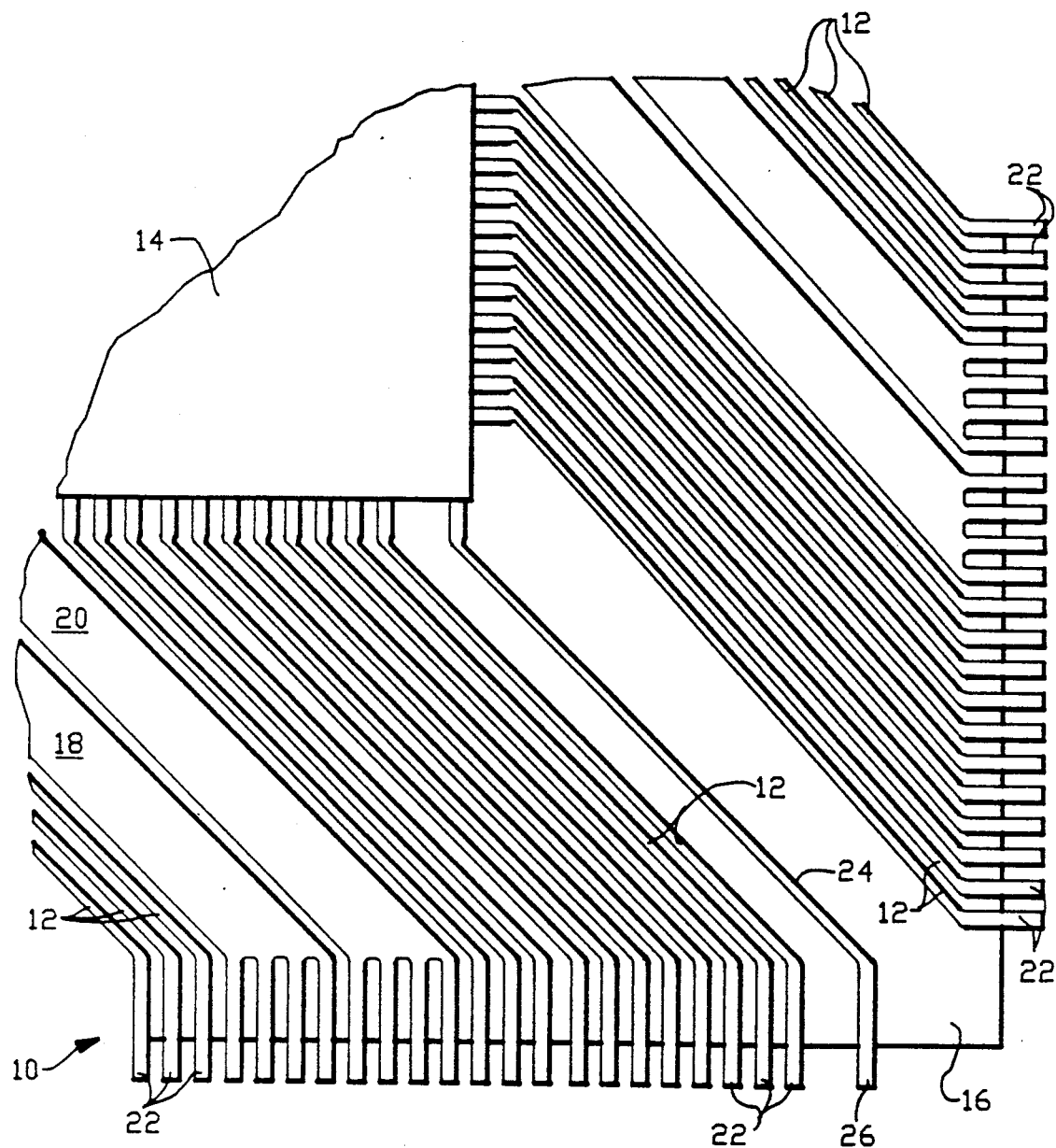
FIG. 1 is a top view of a portion of a tape automated bonding frame having an integrated circuit chip attached thereto.

With reference to FIG. 1, a tape automated bonding frame 10 is shown as having a plurality of conductive traces 12 or fingers which attach at inner leads to a semiconductor chip 14. An exemplary configuration would be a semiconductor chip 14 having 408 connection sites, with each of the conductive fingers 12 attached to one of the sites. The conductive fingers are simultaneously bonded by thermocompression or gold-tin eutectic methods to bumps on a chip 14. The bumps on the chip are gold bumps deposited on aluminum pads to insure a good surface for thermocompression bonding. This "inner lead bonding" method, however, is not critical to the present invention.

Likewise, the "fan out" configuration of conductive fingers 12 radiating from the chip 14 is not critical. The fingers may alternatively be parallel traces extending perpendicularly from the chip. The fingers are spaced together so closely that the center-to-center distance, or pitch, of two fingers may be 4 mils.

The conductive fingers 12 are formed from a copper foil. A portion of the copper is etched away using techniques known in the art. The etching forms the electrically isolated conductive fingers. For utility planes, the etching process may leave a larger area of copper, as shown at 18 and 20. For example, plane 18 may be at ground potential and plane 20 may be at a potential of 5 volts d.c. To aid in the bonding process, the copper fingers 12 are preferably nickel plated and covered with a coating of gold.

An insulative tape 16 is used to support the fragile conductive fingers 12. The insulative tape is a polymer having a hole at its center for mounting of the semiconductor chip 14. The center hole allows space for the inner lead bonding.

The resulting assembly of the chip 14 and the tape automated bonding frame 10 is essentially a space transformer to afford testing of the chip 14 and, after testing, interconnection with a second chip. The chip device can be thoroughly exercised electrically or may be burned-in before assembly. This testing is not possible in many other fabrication procedures. Typically, prior to testing the fingers extend beyond what is shown in FIG. 1. If the results of testing are positive, the fingers are cut to a shorter length for connection to outside circuitry. This allows testing apparatus to contact the fingers without affecting the integrity of a later bond.

As shown in FIG. 1, the fingers 12 have portions which extend beyond the insulative tape 16. These portions 22 are referred to in the art as "outer leads." For purposes of describing the present invention, one conductive finger 24 and its outer lead 26 is illustrated as being spaced apart from the remainder of the fingers 12.

Figure 2:
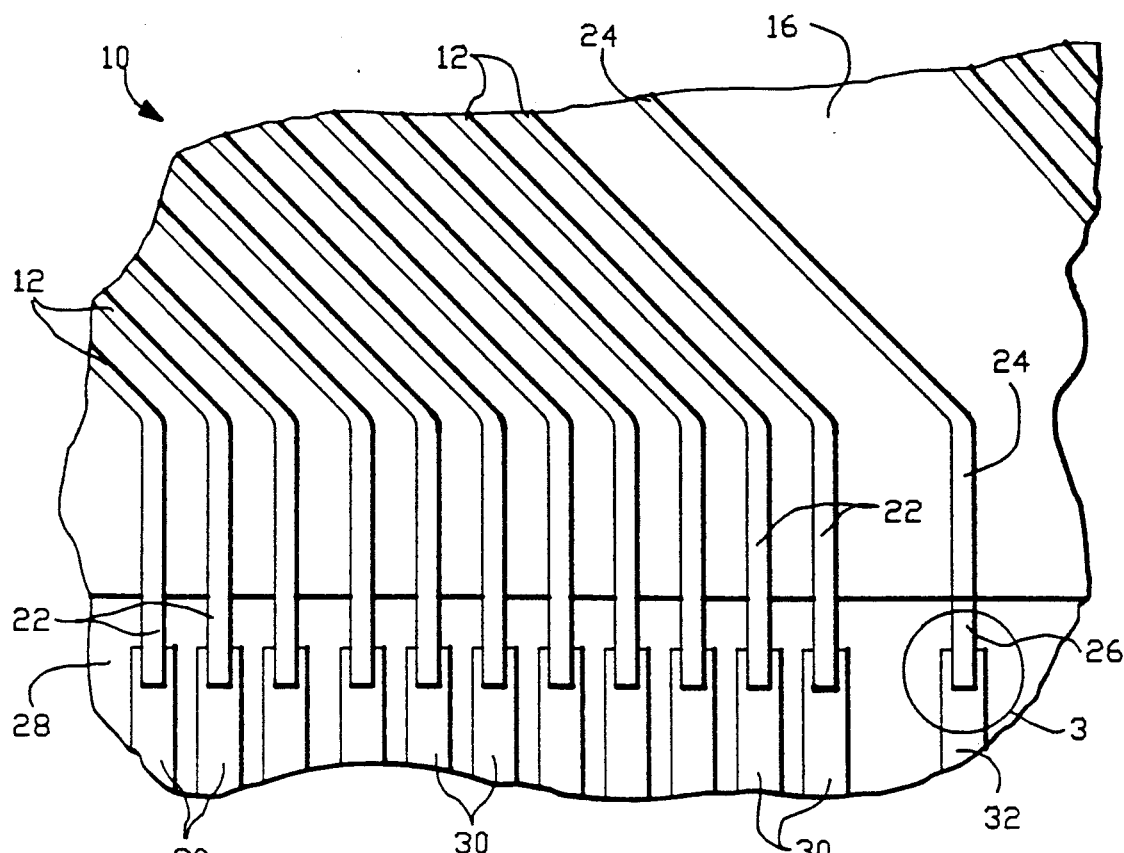
FIG. 2 is a top view of the tape automated bonding frame of FIG. 1 attached to a substrate.

Referring now to FIG. 2, a properly functioning semiconductor chip is interconnected with other circuitry by attachment of the outer leads 22 and 26 of the fingers 12 and 24. The tape automated bonding frame 10 is mounted to a substrate 28 in a manner such that the outer leads are aligned with substrate traces 30 and 32. The substrate traces 30 and 32 act as connection sites for attachment to the outer leads. Preferably, the outer leads 22 and 26 overlap the substrate traces. As will be explained more fully below, this overlap is for the purpose of avoiding added inductance.

To this point, the explained procedure is in keeping with what is known in the art. In the prior art method, alignment of the outer leads 22 and 26 would then be followed by bonding of the outer leads to the substrate traces 30 and 32. The attachment may be by any one of the techniques of thermocompression bonding, ultrasonic bonding or thermosonic bonding. The problem which is experienced in the art is one of reworking or replacing the semiconductor chip after the microbonding. Removal of the chip from the substrate 28 may require disconnection of more than 400 outer leads 22 and 26 from the connection sites of the substrate traces 30 and 32. Even after removal, the task of replacing a chip is a laborious one since each connection site on the substrate must be cleaned and prepared for connection to a replacement chip and tape automated bonding frame.

Figure 3:
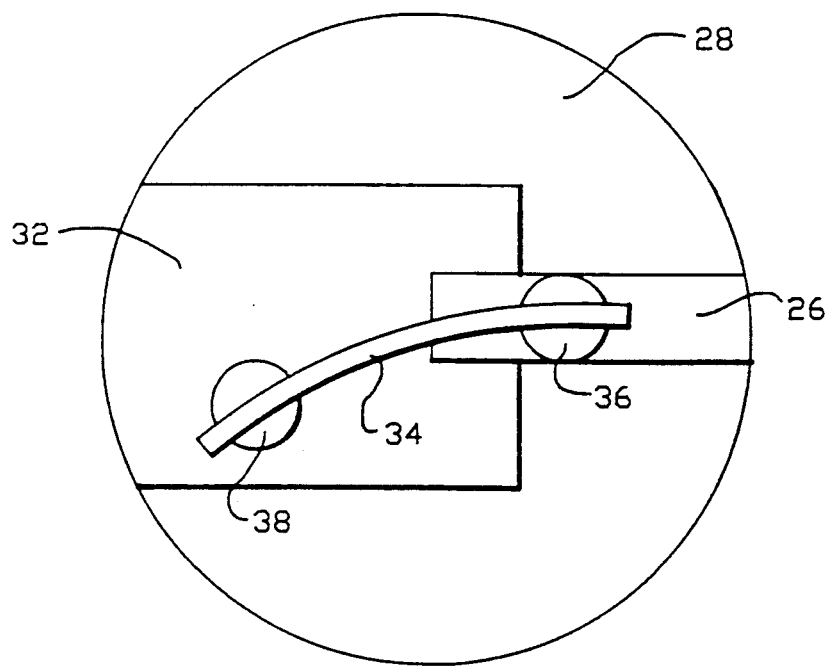
FIG. 3 is a top view of an outer lead bond in accord with the present invention, taken within circle 3 of FIG. 2.

Referring now to FIG. 3, the present invention includes bond wires 34 which extend from the outer leads 26 to the substrate traces 32. The bond wire 34 may be an aluminum wire, but is preferably constructed of gold. A ball bond 36 at one end of the wire fixes the wire to the outer lead 26, while a second ball bond 38 attaches the wire to the substrate trace 32. Thus, input and output signals are able to travel between the substrate trace 32 and the outer lead 26 via the bond wire 34. This is true of each of the outer leads 22 and substrate traces 30 shown in FIG. 2.

The ball bonds 36 and 38 are formed by an ultrasonic technique. Alternatively, the wire 34 may be attached to the outer lead 26 and the substrate trace 32 by thermocompression or thermosonic techniques.

The substrate 28 is the package of a multi-chip module. However, this is not critical. The use of bond wires to replace the direct bonding of the outer leads to the substrate traces may effectively be used in applications other than multi-chip modules. For example, substrate 28 can be a standard printed circuit board or part of a single-chip package.

As noted above, the outer leads 22 and 26 of FIG. 2 are aligned to the substrate traces 30 and 32. Preferably, the outer leads overlap the substrate traces. Thus, the bond wires 34 can remain very short. This insures that the electrical connection of the outer lead 26 to the substrate trace 32 does not significantly add inductance to the circuit.

Because the bond wire 34 is used to provide electrical communication between the outer lead 26 and the substrate trace 32, a tape automated bonding frame 10 is more easily replaced or reworked than if the standard procedure of microbonding the outer lead to the substrate trace is followed. In one embodiment, the tensile strength of the bond wire 34 is less than the tensile strength of the outer lead 26. Thus, the bond wire will break upon removal of the tape automated bonding frame 10. A replacement frame can then be aligned with the substrate traces 30 and 32, whereafter replacement wires are used to interconnect the substrate traces and the second tape automated bonding frame. As shown in FIG. 3, there is ample room for microbonding a second wire to substrate trace 32. In certain applications, it may not be necessary to remove the broken bond wires 34 for replacement of a tape automated bonding frame. However, it is preferable to remove the broken wires. In contrast to the prior art technique of directly bonding the outer leads to the substrate traces, the bond wires 34 do not require a cleaning and preparation for attachment of a second bond wire. This significantly reduces the tediousness of replacing tape automated bonding frames which may include hundreds of leads.

A second embodiment is one in which the bond strength ("$B^1$") of the outer lead 26 to the wire 34 is greater than the bond strength ("$B^2$") of the wire to the substrate trace 32. That is, the bond strength at 36 is greater than the bond strength at 38. The wires are then peeled from the substrate trace 32 at ball bond 38 by removal of the tape automated bonding frame from the substrate 28. Because the wires 34 are removed with the tape automated frame, a replacement frame may be immediately brought into position. In this embodiment, it is imperative that the bond strength ($B^2$) of the wires to the substrate traces 32 is less than the bond strength ("$B^3$") of the substrate traces 32 to the substrate 28. The relationships are therefore $B^1 > B^2$ and $B^3 > B^2$. This insures that the wires are peeled from the substrate traces without affecting the attachment of the substrate traces to the substrate. As a result, it is not necessary to individually remove the bond wires.

Wire bonding of the outer leads also facilitates rework of the assembly comprising the chip 14, the frame 10 and the substrate 28. For example, the wires can easily be detached and reattached if realignment of the conductive fingers 12 and 24 is required.

We claim:
1. An electronic assembly comprising:
   a semiconductor device having a first pattern of chip pads;
   a lead frame having a plurality of unitary conductive fingers having inner lead portions disposed in a second pattern in alignment with the first pattern, the inner lead portions attached to the chip pads, the unitary conductive fingers having outer lead portions arranged in a third pattern;
   a substrate having a fourth pattern of substrate connection sites in alignment with the third pattern of outer lead portions;
   a plurality of conductive wires, each attached at a first end to one of said outer lead portions and attached at a second end to one of the substrate connection sites; and the outer lead portions are in frictional contact with a portion of said substrate connection sites.
2. An electronic assembly comprising,
   a semiconductor chip having a pattern of chip pads on a first surface of said semiconductor chip,
   a tape automated bonding frame having a plurality of unitary conductive fingers, each unitary conductive finger having an inner lead portion extending onto said semiconductor chip and contacting one of said chip pads, each unitary conductive finger having an outer lead portion,
   a substrate having a pattern of substrate traces, said outer lead portions of said unitary conductive fingers in frictional contact with said substrate traces, and
   conductive bond wires bonded to said outer lead portions and to said substrate traces for electrical communication between said unitary conductive fingers and said substrate traces.

* * * * *